(12) United States Patent
Yudovsky et al.

(10) Patent No.: US 10,351,956 B2
(45) Date of Patent: Jul. 16, 2019

(54) INTEGRATED TWO-AXIS LIFT-ROTATION MOTOR CENTER PEDESTAL IN MULTI-WAFER CAROUSEL ALD

(71) Applicant: Applied Materials, Inc., Santa Clara, CA (US)

(72) Inventors: Joseph Yudovsky, Campbell, CA (US); Kaushal Gangakhedkar, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 685 days.

(21) Appl. No.: 14/706,405

(22) Filed: May 7, 2015

(65) Prior Publication Data
US 2015/0236566 A1 Aug. 20, 2015

Related U.S. Application Data

(63) Continuation-in-part of application No. PCT/US2014/028502, filed on Mar. 14, 2014.

(60) Provisional application No. 62/008,485, filed on Jun. 5, 2014, provisional application No. 61/783,418, filed on Mar. 14, 2013.

(51) Int. Cl.
*C23C 16/458* (2006.01)
*H02K 7/14* (2006.01)
*H02K 7/06* (2006.01)

(52) U.S. Cl.
CPC ........ *C23C 16/458* (2013.01); *C23C 16/4584* (2013.01); *H02K 7/06* (2013.01); *H02K 7/14* (2013.01)

(58) Field of Classification Search
CPC .... C23C 16/458; C23C 16/4584; H02K 7/06; H02K 7/14; H01L 21/6838; B25B 11/005
USPC .......... 310/10; 269/21; 279/3; 118/728, 500; 156/345.51
See application file for complete search history.

(56) References Cited

U.S. PATENT DOCUMENTS

| | | | |
|---|---|---|---|
| 5,186,718 A | 2/1993 | Tepman et al. | |
| 5,273,553 A | * 12/1993 | Hoshi | ............... H01L 21/67092 148/DIG. 6 |
| 5,356,476 A | * 10/1994 | Foster | .................... C23C 16/14 118/715 |
| 2009/0120368 A1 | 5/2009 | Lubomirsky et al. | |

FOREIGN PATENT DOCUMENTS

| | | |
|---|---|---|
| CN | 101194040 A | 6/2006 |
| CN | 101527254 A | 9/2009 |
| WO | 2006132878 A2 | 12/2006 |

* cited by examiner

*Primary Examiner* — Rudy Zervigon
(74) *Attorney, Agent, or Firm* — Servilla Whitney LLC

(57) ABSTRACT

Apparatus and methods for processing a semiconductor wafer including a two-axis lift-rotation motor center pedestal with vacuum capabilities. Wafers are subjected to a pressure differential between the top surface and bottom surface so that sufficient force prevents the wafer from moving during processing, the pressure differential generated by applying a decreased pressure to the back side of the wafer through interface with the motor assembly.

17 Claims, 8 Drawing Sheets

INTEGRATED TWO-AXIS LIFT-ROTATION MOTOR CENTER PEDESTAL IN MULTI-WAFER CAROUSEL ALD

CROSS-REFERENCE TO RELATED APPLICATIONS

This application claims priority to U.S. Provisional Application No. 62/008,485, filed Jun. 5, 2014, and this application is a continuation-in-part of International Application No. PCT/US2014/028502, filed Mar. 14, 2014, published as WO 2014/152977 A1 on Sep. 25, 2014, which claims priority to U.S. Provisional Application No. 61/783,418, filed Mar. 14, 2013, the entire disclosures of which are hereby incorporated by reference herein.

FIELD

Embodiments of the disclosure generally relate to apparatus and methods of holding a substrate during processing. In particular, embodiments of the disclosure are directed to apparatus and methods using differential pressure to hold substrates on a susceptor under large acceleration forces.

BACKGROUND

In some CVD and ALD processing chambers, the substrates, also referred to herein as wafers, move relative to the precursor injector and/or heater assembly. If the motion creates acceleration forces larger than that of the frictional force, the wafer can become displaced causing damage or related issues. The wafers placed off-axis can slip at high acceleration/deceleration on a moving/rotating susceptor. Friction from the weight of the wafer itself may be insufficient to hold the wafer on tools where higher throughput is sought.

To prevent rotational forces from dislodging the wafer during process, additional hardware to clamp or chuck the wafer in place may be used. The additional hardware can be expensive, difficult to install, difficult to use and/or cause damage to the wafers during use.

Accordingly, there is a need in the art for methods and apparatus capable of keeping a wafer in position during processing to prevent accidental damage to the wafer and hardware.

SUMMARY

One or more embodiments of the disclosure are directed to a motor assembly comprising a motor housing having a top portion and a bottom portion. A drive shaft extends a distance from the top portion of the motor housing and has a cavity therein. A first motor is within the motor housing to rotate the drive shaft within the motor housing about a central axis. A second motor is adjacent the bottom portion of the motor housing, the second motor is in communication with at least one rail within the motor housing to move the first motor and hollow shaft along the central axis.

Additional embodiments of the disclosure are directed to a motor assembly comprising a motor housing, a drive shaft, a first motor, a second motor, a seal housing and a water jacket. The motor housing has a top portion and a bottom portion. The drive shaft extends a distance from the top portion of the motor housing. The drive shaft has a cavity therein with at least one channel forming a fluid connection to the cavity. The first motor is within the motor housing to rotate the drive shaft within the motor housing about a central axis. The second motor is adjacent the bottom portion of the motor housing and is in communication with at least one rail within the motor housing to move the first motor and hollow shaft along the central axis. The seal housing is within the motor housing and has a gas volume therein. The seal housing is positioned around a portion of the drive shaft. The gas volume is in fluid communication with the cavity in the drive shaft through the at least one channel. The water jacket is in contact with a lower portion of the drive shaft partially surrounded by the seal housing.

Further embodiments of the disclosure are directed to processing chambers comprising at least one gas distribution assembly within the processing chamber. A susceptor assembly is below the at least one gas distribution assembly and includes a top surface, a bottom surface and at least one recess in the top surface to support a wafer. A motor assembly comprises a motor housing, a drive shaft, a first motor and a second motor. The motor housing has a top portion and a bottom portion. The drive shaft extends a distance from the top portion of the motor housing and has a cavity therein. The first motor is within the motor housing to rotate the drive shaft within the motor housing about a central axis. The second motor is adjacent the bottom portion of the motor housing. The second motor is in communication with at least one rail within the motor housing to move the first motor and hollow shaft along the central axis to move the susceptor assembly closer to and away from the at least one gas distribution assembly. At least one passage extends between a bottom surface of the at least one recess in the susceptor assembly and the cavity in the drive shaft, wherein a vacuum formed in the cavity of the drive shaft is in fluid communication with the recess in the susceptor assembly through the at least one passage.

BRIEF DESCRIPTION OF THE DRAWINGS

So that the manner in which the above recited features of the disclosure are attained and can be understood in detail, a more particular description of the disclosure, briefly summarized above, may be had by reference to the embodiments thereof which are illustrated in the appended drawings. The appended drawings illustrate only typical embodiments of this disclosure and are therefore not to be considered limiting of the scope of the disclosure, for the disclosure may admits to other equally effective embodiments.

To facilitate understanding, identical reference numerals have been used, where possible, to designate identical elements that are common to the figures. It is contemplated that elements and features of one embodiment may be beneficially utilized in other embodiments without further recitation.

DETAILED DESCRIPTION

Embodiments of the disclosure provide methods and apparatus capable of keeping a wafer in position during processing to prevent or minimize accidental damage to the wafer and hardware. Specific embodiments of the disclosure are directed to apparatus and methods for creating a differential pressure developed from a unique precursor injector design with a magnitude sufficient to hold wafers in place at high rotation speeds. As used in this specification and the appended claims, the terms "wafer", "substrate" and the like are used interchangeably. In some embodiments, the wafer is a rigid, discrete substrate.

In some spatial ALD chambers, the precursors used for deposition are injected in close proximity to the wafer surface. To develop the gas dynamics, the injector channels are independently controlled at a higher pressure than the surrounding chamber. By creating a pressure differential between the front side of the wafer and the back side of the wafer, a positive pressure force adequate to hold the wafer against relativity larger acceleration force can be generated.

Embodiments of the disclosure are directed to the use of differential pressure to hold substrates (wafers) on a susceptor under large acceleration forces. The large acceleration forces occur as a result of high rotation speeds, which may be experienced in carousel-type processing chambers, from larger batch sizes and processing speeds or higher reciprocating motion for higher wafer throughput.

In some embodiments, the wafers sit in shallow pockets on a susceptor below the injector assembly. The susceptor can provide heat transfer, improved gas dynamics and/or act as a carrier vehicle for the substrates.

Embodiments of the disclosure are directed to susceptors with an angled hole for vacuum from inner diameter of susceptor-bottom up to the wafer pocket. The susceptor can connect to a vacuum source through the rotation shaft and rotation motor below the shaft. If the susceptor is made of Silicon Carbide Coated (SiC) Graphite, then additional holes which are spaced, for example, every three times hole diameter, can be provided from top or bottom of the susceptor for better penetration of the SiC coating. The redundant holes are plugged for vacuum. Graphite plugs can be press-fit before SiC Coating and then the susceptor is SiC coated. In some embodiments, threaded SiC Coated plugs on SiC Coated susceptor and a second SiC coat can be applied for better sealing of graphite with SiC for more corrosive applications.

Figure 1:
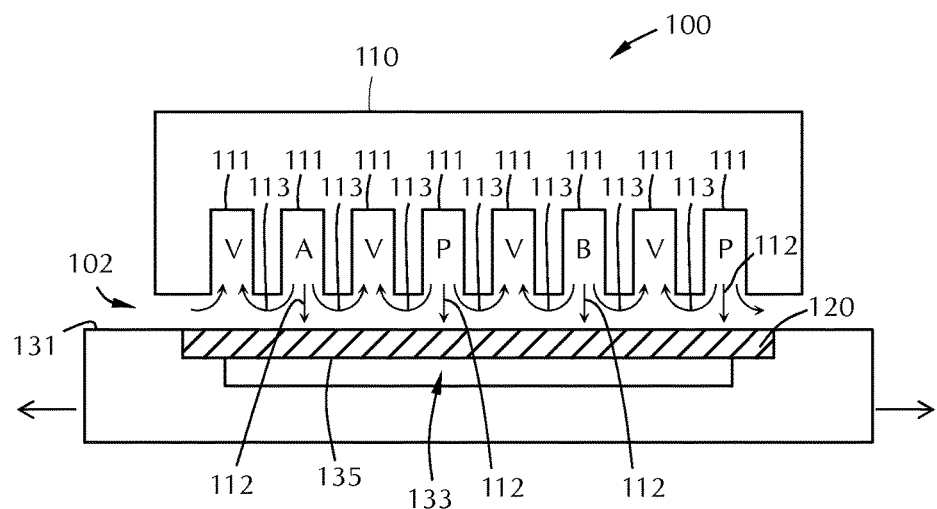
FIG. 1 shows a partial cross-sectional view of a processing chamber in accordance with one or more embodiment of the disclosure.

FIG. 1 shows a portion of a processing chamber 100 in accordance with one or more embodiments of the disclosure. The processing chamber 100 includes at least one gas distribution assembly 110 to distribute reactive gases to the chamber. The embodiment shown in FIG. 1 has a single gas distribution assembly 110, but those skilled in the art will understand that there can be any suitable number of gas distribution assemblies. There can be multiple assemblies with spaces between each assembly, or with practically no space between. For example, in some embodiments, there are multiple gas distribution assemblies 110 positioned next to each other so that the wafer 120 effectively sees a consistent repetition of gas streams.

Figure 2:
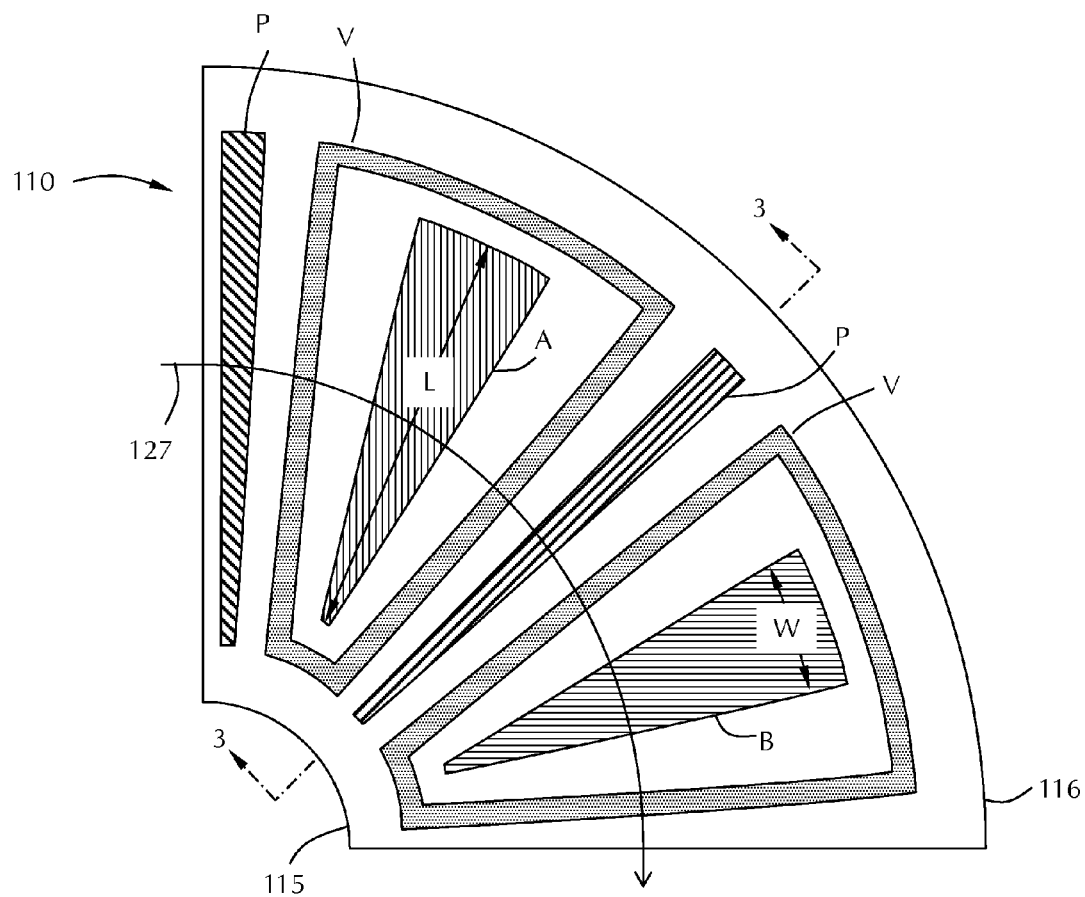
FIG. 2 shows a view of a portion of a gas distribution assembly in accordance with one or more embodiment of the disclosure.

While various types of gas distribution assemblies 110 can be employed (e.g., showerheads), for ease of description, the embodiment shown in FIG. 1 shows a plurality of substantially parallel gas channels 111. As used in this specification and the appended claims, the term "substantially parallel" means that the elongate axis of the gas channels 111 extend in the same general direction. There can be slight imperfections in the parallelism of the gas channels 111. However, those skilled in the art will understand that a carousel-type processing chamber may rotate the wafers about a central axis offset from the central axis of the wafer. In this configuration, gas channels 111 that are not substantially parallel may be useful. Referring to FIG. 2, the gas distribution assembly 110 may be a pie-shaped segment in which the gas channels 111 extend from in inner edge 115 of the pie-shape toward the outer edge 116 of the pie-shape. The shape of the gas channels 111 can also vary. In some embodiments, the gas channels 111 have a substantially uniform width along the length of the channel extending from the inner edge 115 to the outer edge 116. In some embodiments, the width W of the gas channel 111 increases along the length L of the channel extending from the inner edge 115 to the outer edge 116. This is shown in FIG. 2, where the gas channels 111 have a smaller width near the inner edge 115 and a wider width near the outer edge 116. The aspect ratio of the change in width, in accordance with some embodiments, may be equal to the radial difference in position so that the edges of each channel extend from the same point. This may result in all points of a wafer having about equal residence time under the gas channel. Stated differently, each channel width may change as a function of the distance from center of the susceptor rotation.

Referring back to FIG. 1, the plurality of gas channels 111 can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface 121 of the wafer 120. The gas flow is shown with arrows 112. Some of the gas flow moves horizontally across the surface 121 of the wafer 120, up and out of the processing region through the vacuum V channel(s), shown with arrows 113. A substrate moving from the left to the right will be exposed to each of the process gases in turn, forming a layer on the substrate surface. The substrate can be in a single wafer processing system in which the substrate is moved in a reciprocating motion beneath the gas distribution assembly, or on a carousel-type system in which one or more substrates are rotated about a central axis passing under the gas channels. FIG. 2 shows a portion of a carousel-type system in accordance with one or more embodiment of the disclosure. With the orientation of FIG. 2, the process gases can be considered to flow out of the plane of the drawing sheet. A substrate following path 127 will be exposed to each of the processes gases in turn. The path 127 is shown as an arc encompassing about 90° but those skilled in the art will understand that the path 127 can be any length and any portion of an arcuate path.

Figure 3:
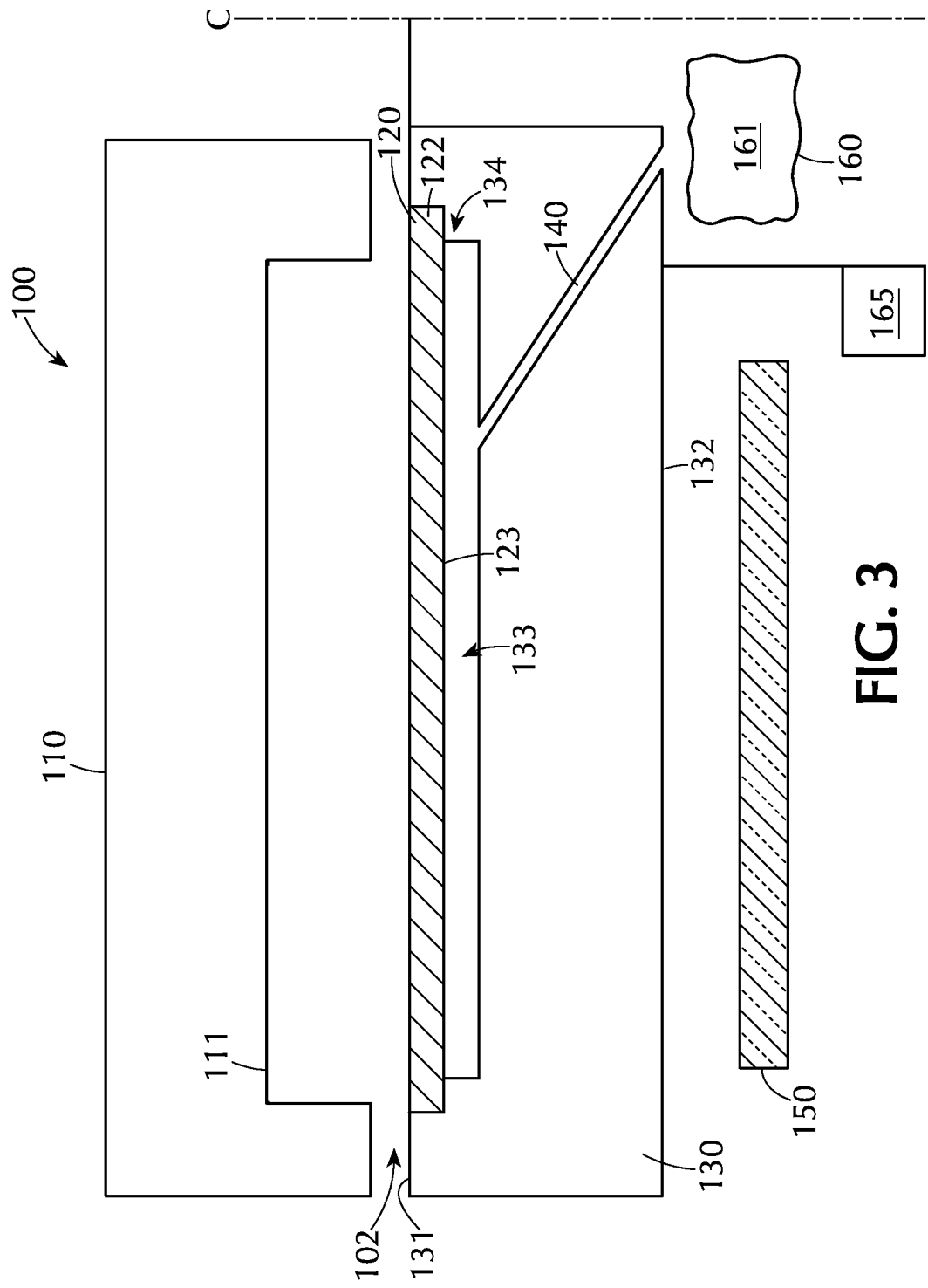
FIG. 3 shows a partial cross-sectional view of a processing chamber in accordance with one or more embodiment of the disclosure.

FIG. 3 shows a cross-section of one or more embodiment of the disclosure. The cross-section portion of the gas distribution assembly 110 can be envisioned as being taken along the length of, for example, a purge gas port of FIG. 2. A susceptor assembly 130 may be positioned beneath the gas distribution assembly 110. The susceptor assembly 130 includes a top surface 131, a bottom surface 132 and at least one recess 133 in the top surface 131. The recess 133 can be any suitable shape and size depending on the shape and size of the wafers 120 being processed. In the embodiment shown, the recess 133 has two step regions 134 around the outer peripheral edge of the recess 133. The step regions 134 can be sized to support the outer peripheral edge 122 of the wafer 120. The amount of the outer peripheral edge 122 of the wafer 120 that is supported by the step regions 134 can vary depending on, for example, the thickness of the wafer and the presence of features already on the back side 123 of the wafer.

In some embodiments, the recess 133 in the top surface 131 of the susceptor assembly 130 is sized so that a wafer 120 supported in the recess 133 has a top surface 121 substantially coplanar with the top surface 131 of the susceptor assembly 130. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The bottom 135 of the recess has at least one passage 140 extending from the bottom of the recess 133 through the susceptor assembly 130 to the drive shaft 160 of the susceptor assembly 130. The passage(s) 140 can be any suitable shape and size and form a fluid communication between the recess 133 and the drive shaft 160. The passage 140 shown in FIG. 3 is angled relative to the bottom of the recess. In some embodiments, the passage 140 comprises more than one leg forming fluid communication with recess. For example, the major portion of the passage 140 can extend parallel to the top surface or bottom surface of the susceptor and connect to a second leg turned relative to the major portion of the passage. The drive shaft 160 can be connected to a vacuum source 165 which forms a region of decreased pressure (referred to as a vacuum) within a cavity 161 of the drive shaft 160. As used in this specification and the appended claims, the term "vacuum" used in this context means a region having a lower pressure than the pressure of the processing chamber. In some embodiments, the vacuum, or region of decreased pressure has a pressure less than about 50 Torr, or less than about 40 Torr, or less than about 30 Torr, or less than about 20, Torr, or less than about 10 Torr, or less than about 5 Torr, or less than about 1 Torr, or less than about 100 mTorr, or less than about 10 mTorr.

The cavity 161 can act as a vacuum plenum so that if there is a loss of external vacuum, the vacuum within the cavity 161 can remain at decreased pressure. The passage 140 is in communication with the cavity 161 so that the vacuum within the cavity 161 can draw on the back side 123 of the wafer 120 through the passage 140.

With a vacuum, or partial vacuum, in the recess 133 below the wafer 120, the pressure in the reaction region 102 above the wafer 120 is greater than the pressure in the recess 133. This pressure differential provides sufficient force to prevent the wafer 120 from moving during processing. In one or more embodiments, the pressure in the recess 133 below the wafer 120 is lower than the pressure above the wafer 120 and the pressure in the processing chamber 100.

The pressure applied to the top surface 121 of the wafer 120 from the gas streams emitted by the gas distribution assembly 110, in conjunction with the decreased pressure beneath the wafer, help hold the wafer in place. This may be of particular use in carousel-type processing chambers in which the wafers are offset from and rotated about a central axis. The centrifugal force associated with the rotation of the susceptor assembly can cause the wafer to slide away from the central axis. The pressure differential on the top side of the wafer versus the bottom side of the wafer, due to the gas pressure from the gas distribution assembly versus the pressure applied by the vacuum to the back side of the wafer, helps prevent the movement of the wafer. The gas channels of the gas distribution assembly can be controlled simultaneously (e.g., all of the output channels—reactive gases and purge channels—controlled together), in groups (e.g., all of the first reactive gas channels controlled together) or independently (e.g., the left-most channel controlled separately from the adjacent channel, etc.). As used in this specification and the appended claims, the term "output channels" "gas channels", "gas injectors" and the like are used interchangeably to mean a slot, channel or nozzle type opening through which a gas is injected into the processing chamber. In some embodiments, the first reactive gas channel, the second reactive gas channel and the at least one purge gas channel are independently controlled. Independent control may be useful to provide a positive pressure on the top surface of the wafer positioned in the recess of the susceptor assembly. In some embodiments, each individual first reactive gas injector, second reactive gas injector, purge gas injector and pump channel can be individually and independently controlled.

The pressure differential between the top surface of the wafer and the bottom surface of the wafer can be adjusted by changing, for example, the pressure of the gases from the gas distribution assembly, the flow rate of the gases from the gas distribution assembly, the distance between the gas distribution assembly and the wafer or susceptor surface and the vacuum pressure. As used in this specification and the appended claims, the differential pressure is a measure of the pressure above the wafer vs. the pressure below the wafer. The pressure above the wafer is the pressure applied to the wafer surface or the pressure in the reaction region 102 of the processing chamber 100. The pressure below the wafer is the pressure in the recess, the pressure on the bottom surface of the vacuum pressure in the susceptor assembly 130. The magnitude of the pressure differential can directly affect the degree to which the wafer is chucked. In some embodiments, the pressure differential between the top surface 121 of the wafer 120 and the bottom surface 123 of a wafer 120 is greater than about 15 torr, or greater than about 10 torr, or greater than about 5 torr. In one or more embodiments, the differential pressure between the top surface 121 of the wafer 120 and the pressure in the recess 133 equates to a chucking force large enough to hold a 300 mm wafer at a bolt center radius of about 320 mm at a rotational speed of about 200 rpm.

In some embodiments, as shown in FIG. 3, the processing chamber 100 includes a heating assembly 150. The heating assembly can be positioned in any suitable location within the processing chamber including, but not limited to, below the susceptor assembly 130 and/or on the opposite side of the susceptor assembly 130 than the gas distribution assembly 110. The heating assembly 150 provides sufficient heat to the processing chamber to elevate the temperature of the wafer 120 to temperatures useful in the process. Suitable heating assemblies include, but are not limited to, resistive heaters and radiant heaters (e.g., a plurality of lamps) which direct radiant energy toward the bottom surface of the susceptor assembly 130.

The distance between the gas distribution assembly 110 and the top surface 121 of the wafer 120 can be tuned and may have an impact on the pressure differential and the efficiency of the gas flows from the gas distribution assembly. If the distance is too large, the gas flows could diffuse outward before encountering the surface of the wafer, resulting in a lower pressure differential and less efficient atomic layer deposition reaction. If the distance is too small, the gas flows may not be able to flow across the surface to the vacuum ports of the gas distribution assembly and may result in a large pressure differential. In some embodiments, the gap between the surface of the wafer and the gas distribution assembly is in the range of about 0.5 mm to about 2.0 mm, or in the range of about 0.7 mm to about 1.5 mm, or in the range of about 0.9 mm to about 1.1 mm, or about 1.0 mm.

The recess 133 shown in FIG. 3 supports the wafer 120 about an outer peripheral edge 122 of the wafer 120. Depending on the thickness, stiffness and/or vacuum pressure in the recess 133, this arrangement can result in the successful chucking of the wafer, preventing or minimizing movement of the wafer during rotation or movement of the susceptor assembly 130. However, if the wafer is not thick or stiff, or the vacuum pressure in the recess 133 is too low, the wafer 120 may deflect so that the center portion of the wafer is further away from the gas distribution assembly 110 than the outer peripheral edge 122 of the wafer 120.

Figure 4:
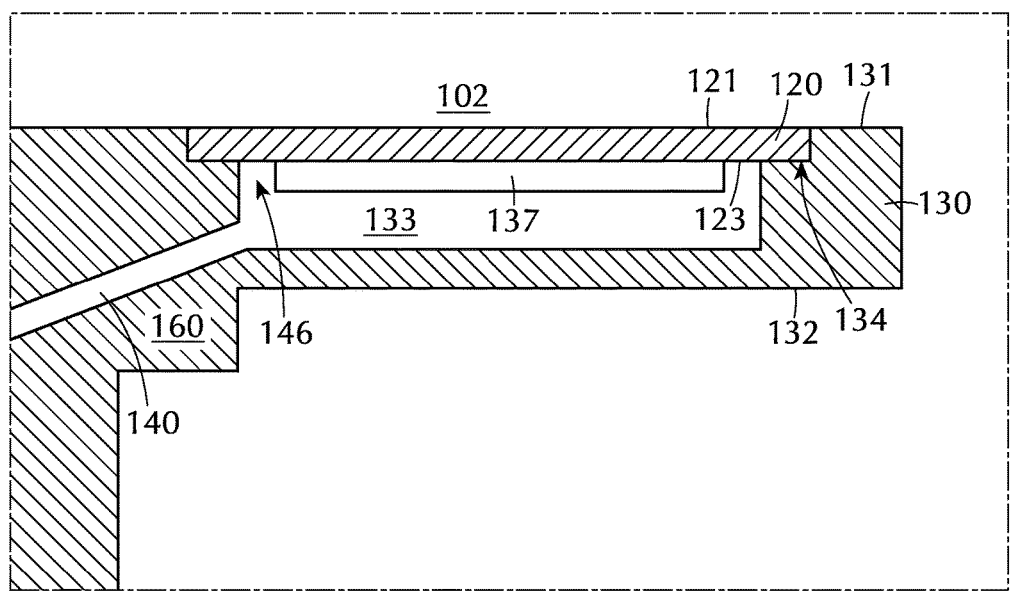
FIG. 4 shows a partial cross-sectional view of a processing chamber in accordance with one or more embodiment of the disclosure.

FIG. 4 shows another embodiment which helps prevent deflection of the wafer by providing a greater support surface area. Here, the wafer 120 is supported across a majority of the back side 123 by the susceptor assembly 130. This Figure shows a cross-section of the susceptor assembly. The center portion 137 of the susceptor assembly 130 is not free floating, but is connected to the remainder of the susceptor in a different plane than the cross-sectional view. The passage 140 extends from the drive shaft 160, or from a cavity 161 within the drive shaft 160 toward the recess 133. The passage 140 connects to a channel 146 which extends toward the top surface 131 of the susceptor assembly 130. The vacuum chucks the wafer 120 to the susceptor assembly 130 by the vacuum through the channel 146 and passage 140.

Figure 5:
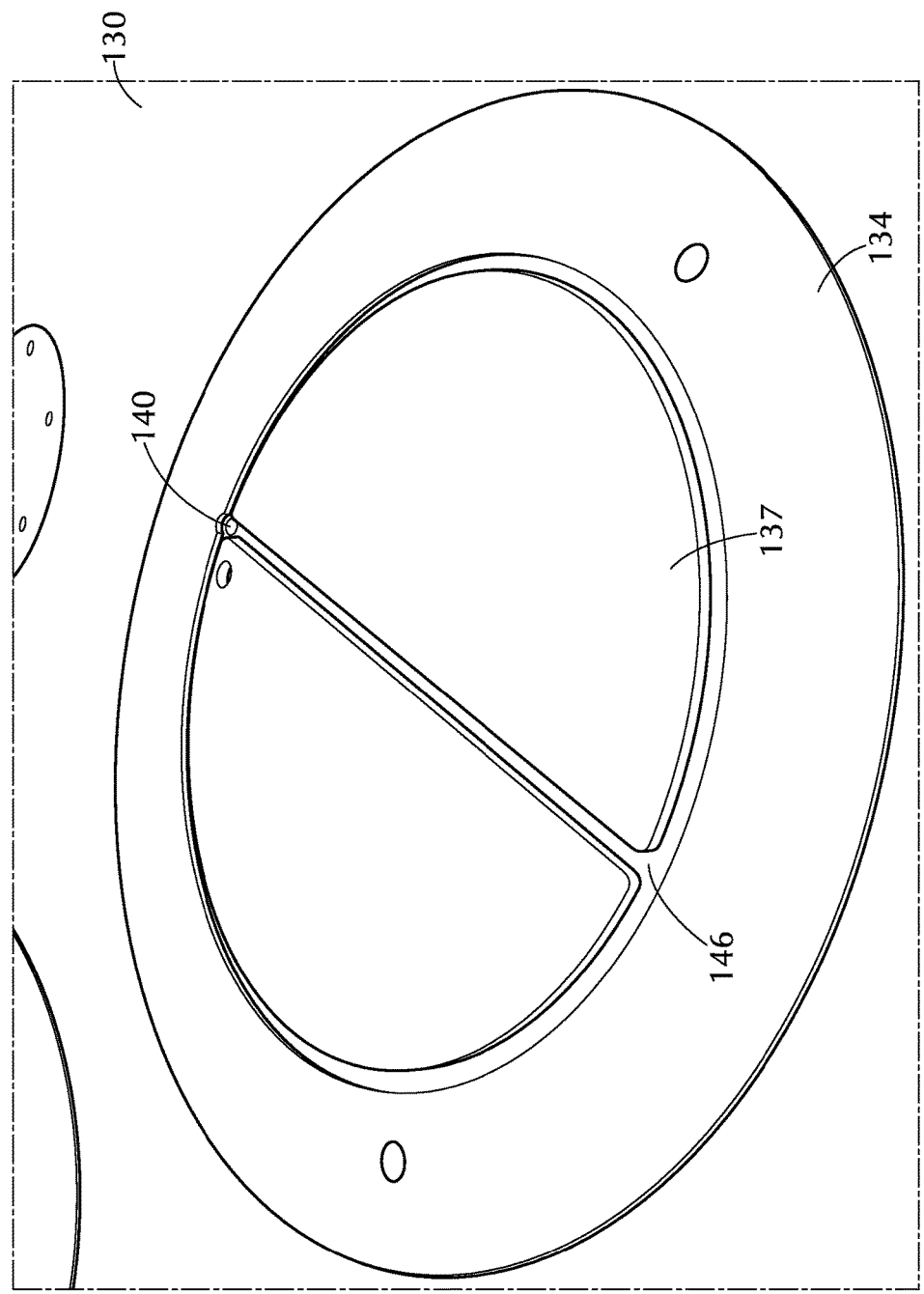
FIG. 5 shows a perspective view of a recess in a susceptor assembly with vacuum passages visible in accordance with one or more embodiment of the disclosure.

FIG. 5 shows a perspective view of a susceptor assembly 130 similar to that of FIG. 4. The susceptor assembly 130 shown has a recess 133 with a relatively large step region 134 to support the outer peripheral edge 122 of the wafer (not shown). The recess 133 includes a large passage 140 connecting the channel 146 to the vacuum in the drive shaft. The channel shown is shaped like a capital theta, providing a channel ring with a channel portion (or cross groove) extending across the diameter of the ring. The center portion 137 of the susceptor assembly 130 may be about coplanar with the step region 134 so that the center portion 137 and the step region 134 support the wafer at the same time.

Figure 6:
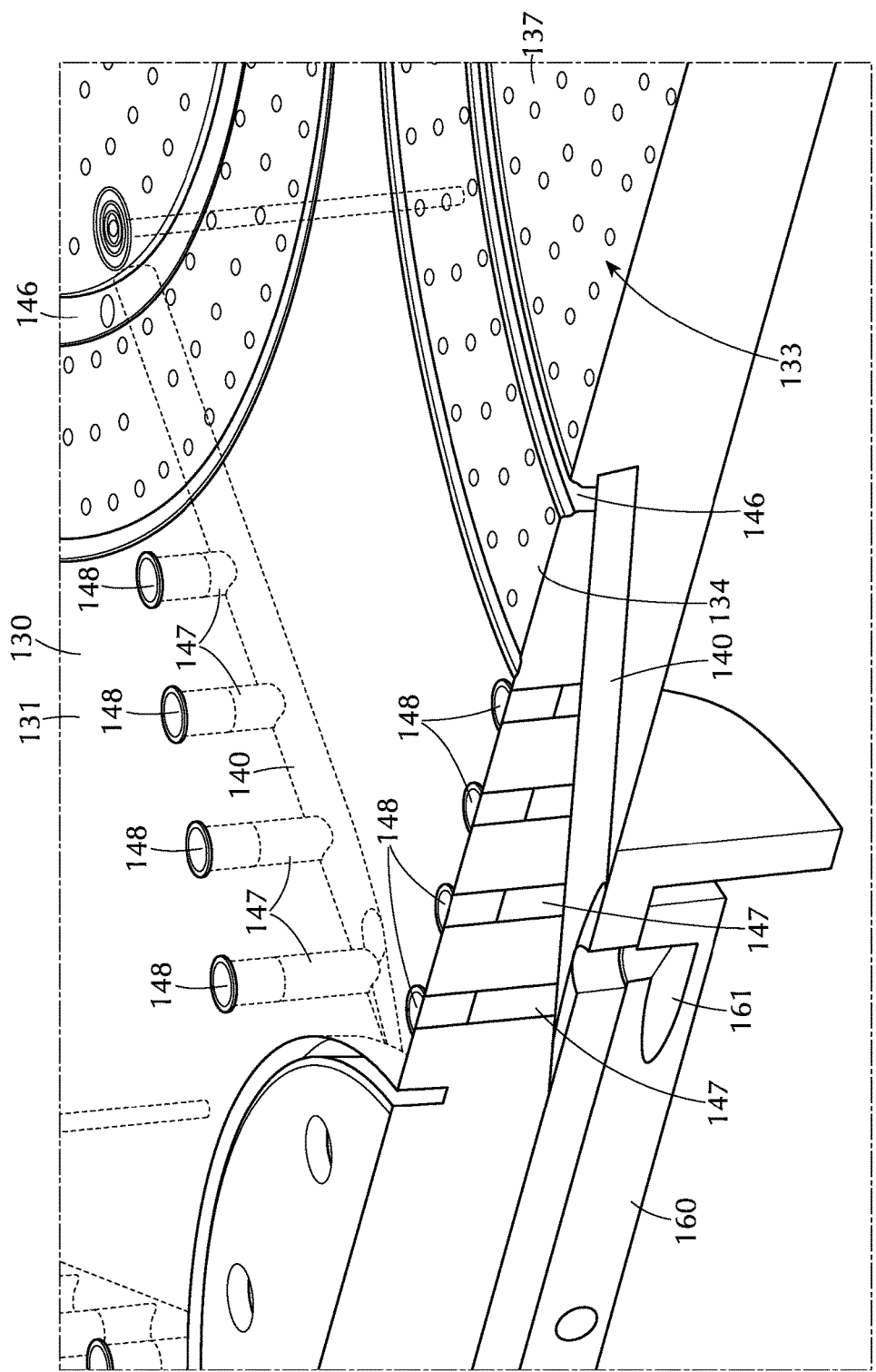
FIG. 6 shows a cross-sectional perspective view of a susceptor assembly in accordance with one or more embodiment of the disclosure.

FIG. 6 shows a perspective view of a susceptor assembly 130 in accordance with one or more embodiments of the disclosure. Here the passage 140 extends from drive shaft 160 toward the recess 133 connecting the cavity 161, which acts as a vacuum plenum, with the channel 146 in the recess. The passage 140 has a plurality of holes 147 connecting the top surface 131 of the susceptor assembly 130 with the passage 140. In some embodiments, there is at least one hole extending from one of the top surface 131 of the susceptor assembly 130 and the bottom surface 132 of the susceptor assembly 130 to the passage 140. These holes 147 can be created (e.g., drilled) during the manufacture of the susceptor assembly to allow the inside of the passage 140 to be coated. For example, in some embodiments, the susceptor assembly 130 has a silicon carbide coating. The susceptor assembly of some embodiments is silicon carbide coated graphite. The holes 147 allow the silicon carbide to be coated on the passage 140 and are then sealed with plugs 148. The plugs can be made of any suitable material including, but not limited to, silicon carbide, silicon carbide coated graphite, a material with a silicon carbide coating and graphite. After the plugs 148 have been inserted into the holes 147, the susceptor assembly can be coated with silicon carbide again to provide an additional sealing of the holes 147. The plugs 148 can be press-fit (e.g., friction fit), connected to the holes 147 by complementary screw threads or connected by some other mechanical connection (e.g., epoxy).

During the preparation of a silicon carbide coated susceptor assembly 130, the holes 147 provide a useful passageway for the silicon carbide to coat the passage 140. The size and spacing of the holes 147 may have an impact on the efficiency of the coating. The holes 147 can be spaced in increments of the hole diameter. For example, if the holes are 5 mm in diameter, the spacing might be 5x mm, with x being any suitable value. For example, the spacing may be 1, 2, 3, 4, 5, 6, 7, 8, 9 or 10 times the hole diameter. The holes 147 can be positioned at any suitable points along the length of the passage 140, and do not need to be evenly distributed across the passage 140 length. As shown in FIG. 6, the holes 147 are concentrated toward the inner portion of the susceptor assembly 130, where the passage 140 is furthest from the top surface 131 of the susceptor assembly 130.

The passages 140 can be used to supply a vacuum to the recess 133 to chuck the wafer 120. However, when the wafer is processed, the vacuum may be too strong to easily remove the processed wafer from the recess. To ease removal of the wafer, the passages 140 can also be used to provide a flow of gas toward the back side of the wafer 120. Thus providing a positive pressure to the back side of the wafer to allow the wafer to be easily removed from the susceptor assembly.

Figure 9:
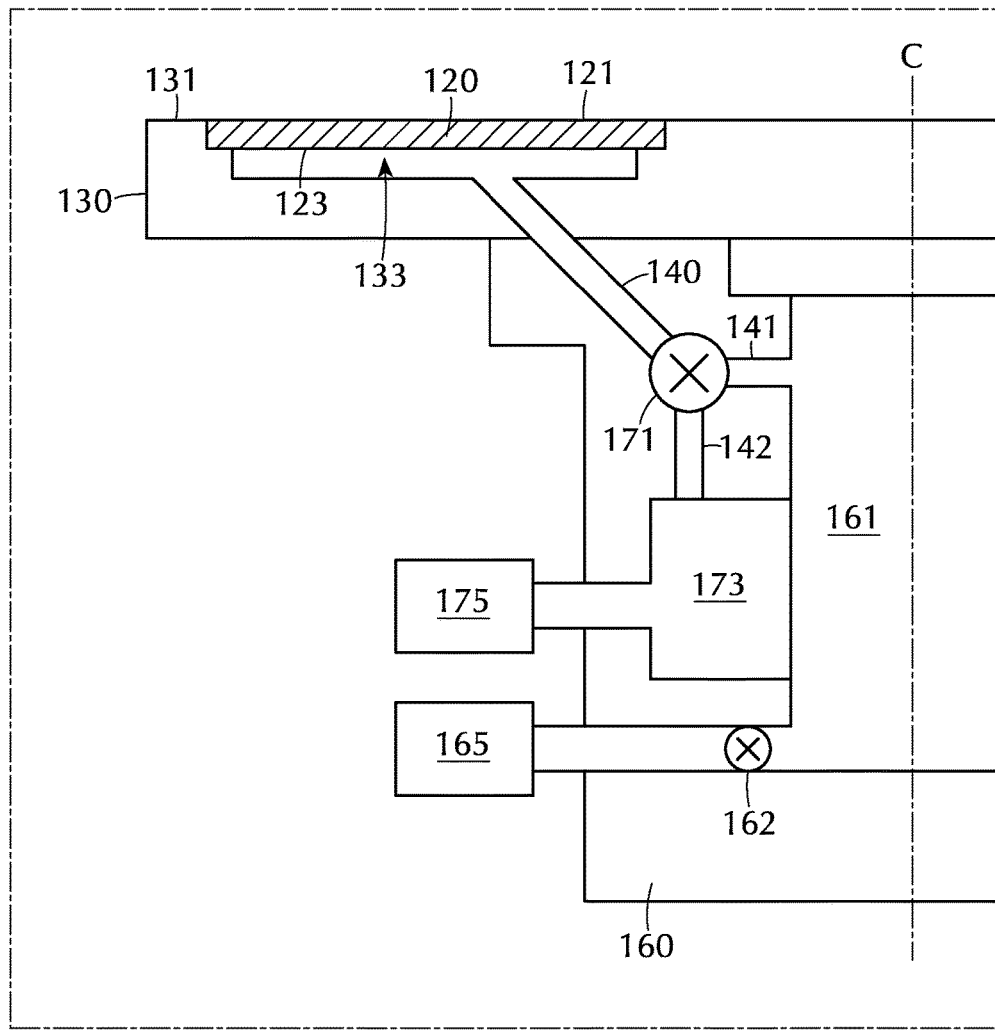
FIG. 9 shows a partial cross-sectional view of a susceptor assembly in accordance with one or more embodiment of the disclosure.

FIG. 9 shows a schematic view of a susceptor assembly in accordance with one or more embodiments of the disclosure. Here, the recess 133 is connected to the passage 140 which leads to the cavity 161 within the drive shaft. A valve 171 is positioned within the passage 140. The valve 171 can allow a fluid connection between the passage 140 and the cavity 161 through connector 141. If a vacuum, or region of decreased pressure, is formed in the cavity 161, then the valve can connect the cavity 161 to the recess 133 through the connector 141 and passage 140. The valve 171 can be switched to break the fluid connection between the passage 140 and the cavity 161. The valve can be set to a closed position, isolating the passage 140, or to a position where a connection is formed between the passage 140 to a dechucking gas plenum 173 through connector 142. The dechucking gas plenum 173 is shown in fluid communication with a dechucking gas source 175. The dechucking gas source 175 can comprise any suitable gas including, but not limited to, nitrogen, argon, helium or an inert gas.

Figure 7:
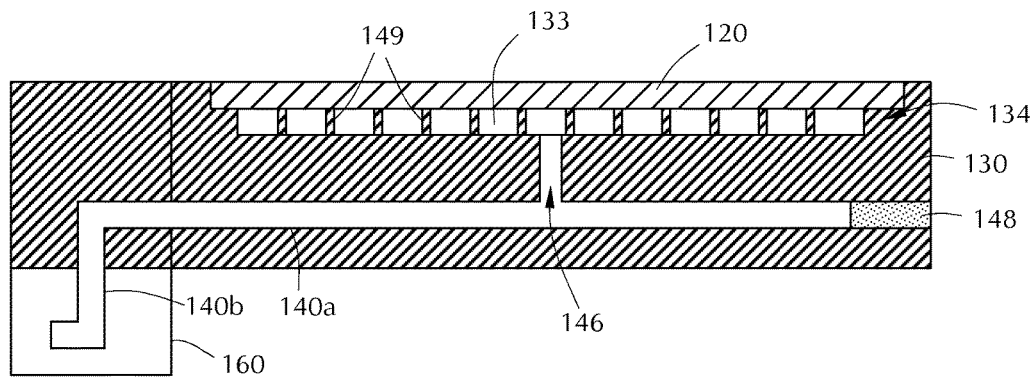
FIG. 7 shows a partial cross-sectional view of a susceptor assembly with vacuum passages in accordance with one or more embodiment of the disclosure.

FIG. 7 shows another embodiment of a susceptor assembly 130. Here, a passage 140 extends about parallel to the bottom of the recess 133 from the outer edge of the susceptor assembly 130. A plug 148 closes the end of the passage 140. The first portion 140*a* of the passage turns to a second portion 140*b* and extends into the drive shaft 160. The channel 146 extends from the passage 140 into the bottom of the recess 133 at about the center of the recess 133. A plurality of standoffs 149 extend from the bottom 135 of the recess 133 to the height of the first step in the step region 134. The plurality of standoffs 149 provide support for the wafer to prevent or minimize bowing. The standoffs 149 are positioned around the recess with gaps between to allow the vacuum to affect the entire recess.

Figure 8:
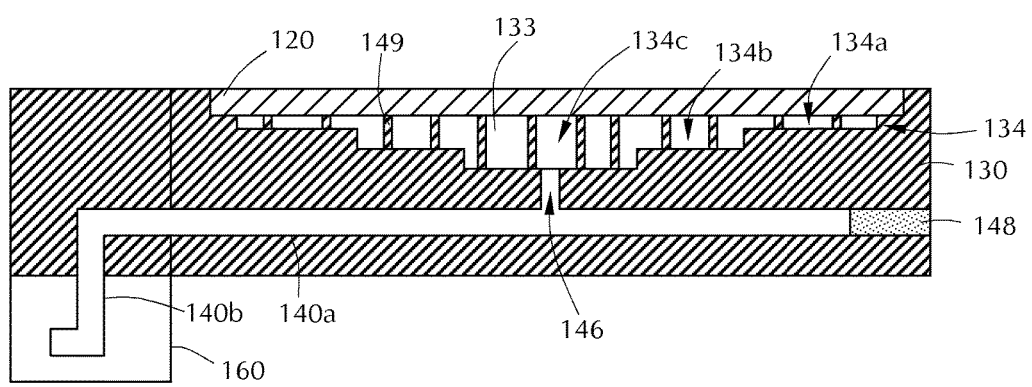
FIG. 8 shows a partial cross-sectional view of a susceptor assembly with vacuum passages in accordance with one or more embodiment of the disclosure.

FIG. 8 shows another embodiment of a susceptor assembly 130. Here the recess comprises a plurality of steps which are progressively larger than the height of the initial step region 134. The first step region 134a has a first height. The second step region 134b has a second height greater than the first height. The third step region 134c has a third height greater than the second height. While three step regions are shown, those skilled in the art will understand that there can be any number of step regions. In the embodiment shown, the heights of the first, second and third step regions increase toward the center of the recess. In some embodiments, the heights of the individual step regions can vary so that some regions have a greater height than other regions independent of the position of the region relative to the center of the recess.

The diameter and heights of the individual step regions can vary. In some embodiments, the first step region 134a has a height in the range of about 10 µm to about 90 µm relative to the initial step region 134. As the wafer 120 rests on the initial step region 134a, the first height is measured relative to the initial step region 134 even though the initial step region 134 is below the level of the top surface 131 of the susceptor assembly 130. In some embodiments, the first height is in the range of about 20 µm to about 80 µm, or in the range of about 30 µm to about 70 µm, or in the range of about 40 µm to about 60 µm.

In the embodiment shown in FIG. 8, the second step region 134b of some embodiments has a height in the range of about 35 µm to about 115 µm, and is greater than the height of the first step region 134a. In some embodiments, the second step region 134b has a height in the range of about 45 µm to about 105 µm, or in the range of about 55 µm to about 95 µm, or in the range of about 65 µm to about 85 µm.

In the embodiment shown in FIG. 8, the third step region 134c has a height in the range of about 60 µm to about 140 µm, and is greater than the height of the second step region 134b. In some embodiments, the third step region 134c has a height in the range of about 70 µm to about 130 µm, or in the range of about 80 µm to about 120 µm, or in the range of about 90 µm to about 110 µm.

The height of the standoffs 149 can vary depending on the height of the particular step region that the standoff is located in. Referring to FIG. 8, the standoffs in the third step region are higher than the standoffs in the first step region. The standoffs of some embodiments have a height sufficient to make the top of the standoff substantially coplanar with the initial step region to that a wafer positioned in the recess is substantially coplanar with the top surface of the susceptor assembly.

The vacuum source 165 can be connected to the cavity 161 through valve 162. The valve 162 can be used to isolate the cavity 161 from the vacuum source 165 in the event that there is a loss of vacuum from the vacuum source 165. This allows the cavity 161 to act as a vacuum plenum so that the wafers on the susceptor assembly remain chucked until while the vacuum source is being reconnected or repaired.

Each of the individual recesses 133 in the susceptor assembly 130 can include a separate passage 140 and valve 171. This allows each individual recess 133 to be isolated from the vacuum in the cavity 161. For example, a processed wafer 120 can be rotated to the loading/unloading area of the processing chamber. The valve 171 can be closed or switched to the dechucking gas plenum 173 to cause a positive pressure on the back side of the wafer, allowing a robot to pick up the wafer. After picking up the wafer, the valve can close so that the pressure in the recess 133 will be equal to the pressure of the chamber. A new wafer can be placed in the recess and the valve 171 switched back to allow fluid connection with the cavity 161 to chuck the new wafer.

In accordance with one or more embodiment of the disclosure, a center pedestal on a carousel style susceptor, driven by integrated two-axis motors for lift and rotation of the susceptor, can also be used for incorporating, for example, nitrogen or vacuum for chucking/de-chucking wafers. Additionally, some embodiments utilize water, or coolant, to maintain seals and motor magnets and electrical grounding of wafers during, for example, plasma treatment Referring to FIG. 9, a schematic of a motor assembly 200 for use with one or more embodiment of the disclosure is presented. The motor assembly 200 has a motor housing 202 with a top portion 203 and a bottom portion 204. The motor assembly 200 shown includes a bottom 206 which may be integrally formed with the sides 207 of housing 202, or can be individual components.

The motor assembly 200 includes a drive shaft 210 which from the top portion 203 of the motor housing 202. The drive shaft 210 includes a body 213 and a cavity 212 therein. The cavity 212 can be in flow communication with a gas or vacuum source and can act as a plenum as described further below.

The drive shaft 210 can be made of any suitable material that is capable of supporting a susceptor assembly during wafer processing while maintaining a cavity within. In some embodiments, the drive shaft 210 is made from a material comprising stainless steel. The dimensions of the drive shaft 210 can vary depending on, for example, the size and weight of the susceptor assembly, or other component, being supported thereon.

The drive shaft 210 extends a distance D from the motor housing 202. This distance D can be varied or changed before, during and/or after processing. In use, the motor assembly 200 supports and rotates susceptor assembly. The distance D that the drive shaft 210 extends from the motor housing 202 is directly related to the vertical height of the susceptor and any wafers supported thereon.

The drive shaft 210 is in contact with a first motor 220 located within the motor housing 202. The first motor 220 rotates the drive shaft 210 within the motor housing 202 about a central axis 211. The drive shaft 210 can be connected to the first motor by contact, friction or hardware. In the embodiment shown in FIG. 10, the drive shaft 210 is connected to a motor/shaft interface 222 which is connected to the first motor 220. The motor/shaft interface 222 can be any suitable material including, but not limited to, stainless steel or aluminum. The motor/shaft interface 222 material may have a coefficient of expansion similar to the coefficient of expansion of the drive shaft 210 or seal housing 240, described below. The first motor 220 can be any suitable type of motor capable of rotating the drive shaft 210. In some embodiments, the first motor 220 is a direct drive motor coupled directly to the hollow drive shaft 210.

The direct drive motor can be lifted up and lowered with a combination of one ball screw motor and two symmetric mechanical rails. In some embodiments, the ball screw is positioned as close to center as possible to minimize shaft tilting. A second motor 230 is positioned adjacent the bottom portion 204 of the motor housing 202. The second motor 230 can be any suitable type of motor including, but not limited to, a ball screw motor. In the embodiment shown in FIG. 10, the second motor 230 is positioned outside the motor housing 202 but could also be located within the motor housing. The second motor 230 is in communication with at least one rail 232 within the motor housing 202 to move the first motor 220 and drive shaft 210 along the length of the central axis 211. Movement along the length of the central axis 211 changes the distance D that the drive shaft 210 extends from the top portion 203 of the motor housing 202. A nut 234 is positioned along the second motor screw 236. Rotation of the screw 236 causes the nut 234 to move along the length of the screw 236.

The second motor 230 can be position anywhere relative to the central axis 211 of the assembly 200. In some embodiments, the second motor 230 is positioned as close as possible to the central axis 211 to minimize racking of the motor assembly during movement. In one or more embodiments, the motor assembly is round and the functional components (e.g., screw, nut and rail) of the second motor 230 are positioned within 50% of the radius of the motor 220 measured from the central axis 211.

In some embodiments, there are at least two symmetric rails 232 within the motor housing 202. The two rails can be position on either side of the central axis 211 or on either side of the screw 236. For example, the single rail 232 shown in FIG. 10 can be two pieces which the nut 234 makes contact with at the same time.

The motor assembly 200 may also include a seal housing 240 for a combination of dynamic seals on z-theta motor provides a vacuum channel for a fast rotating drive shaft 210 which has holes on its side. The seal housing 240 may be positioned within the motor housing 202 and around at least a portion of the drive shaft 210. The seal housing 240 of some embodiments is in fluid communication within one or more of a vacuum source 241 or a gas source (not shown). The vacuum source 241 or gas source can be connected to the seal housing through port 242. In some embodiments, the seal housing 240 includes a gas volume 243 to hold a gas or vacuum. When vacuum source 241 is connected to the seal housing 240, the gas volume 243 is under vacuum. When a gas source (not shown) is connected to the seal housing 240, the gas volume 243 can hold the gas.

Figure 10:
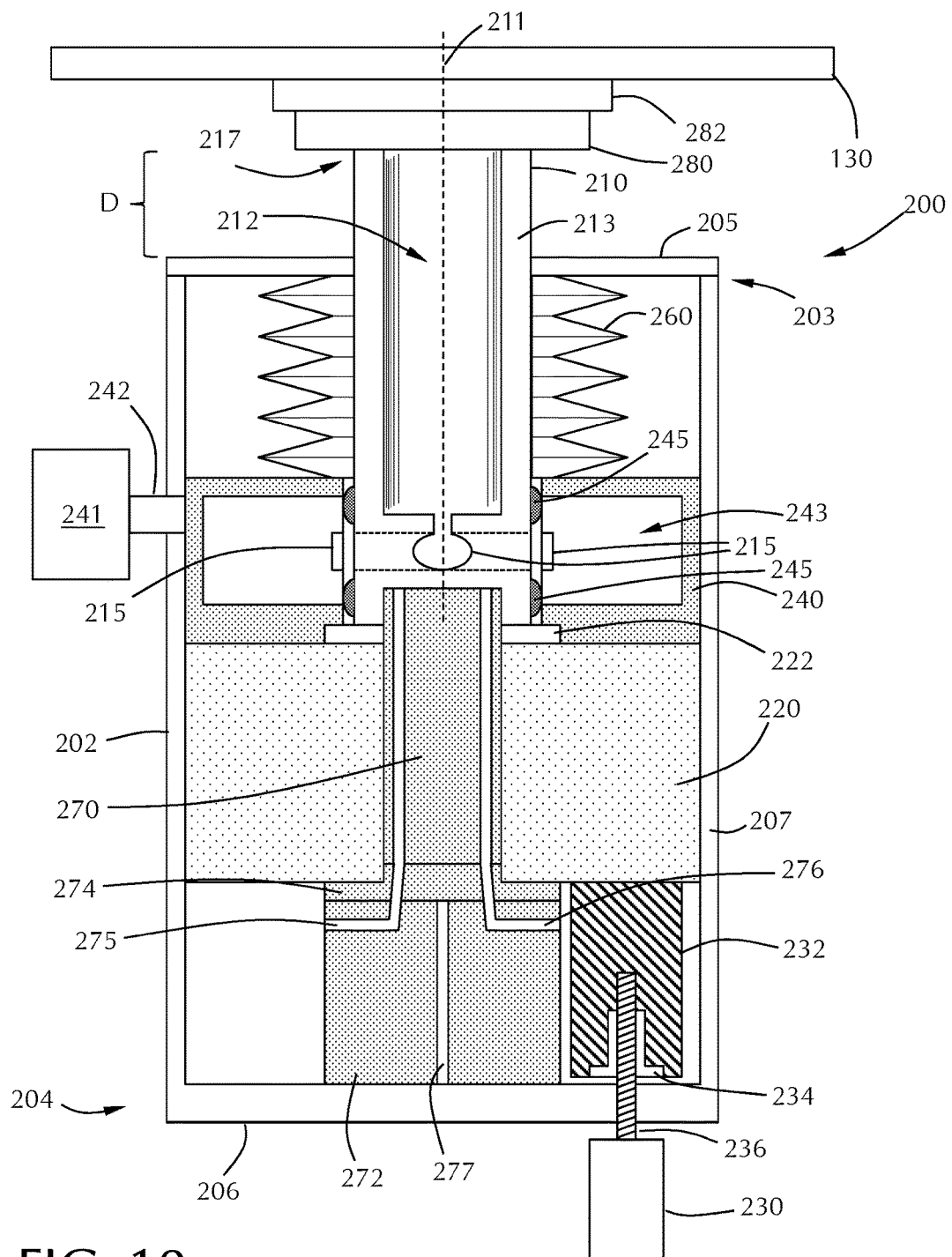
FIG. 10 shows a cross-sectional view of a motor assembly in accordance with one or more embodiment of the disclosure.

The drive shaft 210, as shown in FIG. 10 can include at least one channel 215 forming a fluid connection between the cavity 212 of the drive shaft and the gas volume 243 of the seal housing 240. The seal housing 240 comprises at least one o-ring 245 to form a gas-tight seal between the seal housing 240 and the drive shaft 210. In the embodiment shown in FIG. 10, there are two o-rings 245 shown positioned above and below the channel 215. The o-rings 245 help ensure a gas-tight seal while allowing gases to flow from the cavity 212, through the channel 215 into the seal housing 240 gas volume 243 and ultimately out to vacuum source 241. When a gas source is used instead of a vacuum source, the gas flow path is opposite.

In some embodiments, the at least one channel 215 in the drive shaft extends substantially perpendicular to the central axis 211. As used in this specification and the appended claims, the term "substantially perpendicular" used in this respect means that the angle of the channel 215 axis relative to the central axis 211 is greater than or equal to about 45 degrees. In some embodiments, the angle of the channel axis relative to the central axis 211 is greater than about 15, 20, 25, 30, 35, 40, 45, 50, 55, 60, 65, 70, 75, 80 or 85 degrees.

In one or more embodiments, the angle of the channel axis relative to the central axis is in the range of about 85 to about 90 degrees, or in the range of about 80 to about 90 degrees.

The number of channels 215 formed in the drive shaft 210 can be any suitable number. In some embodiments, 1, 2, 3, 4, 5, 6, 7, 8 or more separate channels extend through the body 213 of the drive shaft 210 forming a fluid connection between the cavity 212 and the gas volume 243. In some embodiments, there are four cross-drilled channels extending through the body 213. The embodiment illustrated in FIG. 10 shows three channels 215 with the middle channel 215 extending behind the plane of the paper. A fourth channel would be a mirror image to the middle channel 215 extending out of the plane of the paper. In one or more embodiments, a single zone 20 mm diameter vacuum feeds to the susceptor and is provided in a circular pocket between shaft lip seal (top o-ring 245) and a quad seal (lower o-ring 245) and then taken up the shaft through four side holes or channels. In some embodiments, the cavity in the drive shaft 210 has a diameter a 100 mm diameter and can be used as a vacuum reservoir for keeping the rest of the wafers chucked during wafer exchange.

Vacuum isolation can be assisted or accomplished using a stainless steel bellow 260 and/or a combination of dynamic lip seals (o-rings 245) which are housed in a seal housing 240. To further isolate the seal housing 240 gas volume 243 from the processing environment, a bellows 260 is positioned between the seal housing and the top 205 of the motor housing 202. The top 205 of the motor housing 202 can be connected to the motor housing sides 207 by any suitable method including. The top 205 can be a separate component attached to the sides 207 mechanically or can be integrally formed with the sides 207. The bellows 260 expands and contracts during movement of the motor 220, drive shaft 210 and seal housing 240 along the length of the central axis 211.

A Rotor shaft that supports the susceptor may be cooled to prevent heat conducting to direct-drive motor magnets and causing demagnetization. The first motor 220, which may be a direct drive motor, can be water cooled by running water through the seal housing 240. Additionally, because the susceptor is often heated to process temperatures up to 550° C., according to an embodiment, the bottom end of the drive shaft 210 is cold to prevent damage to dynamic seals and motor magnets due to overheating. This can be done by attaching, contacting or bolting a water rotary union, or water jacket 270, below the drive shaft 210 with water running up to the seals through a press-fit connection of the water jacket to the shaft. In some embodiments, the water jacket 270 is in contact with the bottom of the drive shaft 210 extending through the motor/shaft interface 222. The water jacket 270 can be connected to the lower portion of the drive shaft 210 but simple contact between the two may suffice to cool the drive shaft 210. During rotation of the drive shaft 210, the water jacket 270 may also rotate, or can remain stationary. In some embodiments, the seal housing 240 is positioned around a portion of the water jacket 270.

Although referred to as a water jacket, those skilled in the art will understand that any type of coolant can be used. For example, automobile antifreeze could be used in place of water. The water jacket 270 is generally made from a material that is a good conductor of heat. In some embodiments the water jacket is made from aluminum.

In the embodiment shown in FIG. 10, the water jacket 270 is connected to a rotary union 272 through a jacket/union interface 274. The rotary union 272 may remain stationary during rotation of the drive shaft 210 while the water jacket 270 rotates with the drive shaft 210. This can be accomplished by coolant (gas or liquid) flowing in through inlet tube 275 into the stationary rotary union 272. The coolant then flows up to the jacket/union interface 274 where the tube connects to the corresponding tube in the water jacket 270 and then out the outlet tube 276.

Electrical multi-conductor slip ring can be bolted below the water rotary union for taking electrical wires up to the susceptor. An electrical connection can be made from the susceptor down through the drive shaft 210 by means of slip ring mounted to the bottom of shaft. The slip ring and the motor/shaft interface 222 (also referred to as as the motor/shaft union) can be the same component or different components. Multiple thermocouple wires for checking susceptor temperatures in multiple zones and multiple wires for grounding the wafers on the susceptor can extend through the drive shaft 210, water jacket 270 through electrical feed conduit 277.

Some embodiments of the disclosure are directed to susceptor assemblies comprising the motor assembly 200, like that of FIG. 10, and a susceptor in communication with the top portion 217 of the drive shaft 210. In some embodiments, a torque plate 280 is connected to the top portion 217 of the drive shaft 210. The torque plate 280 forms an interface between the drive shaft 210 and the susceptor assembly 130. In some embodiments, as shown in FIG. 10, a reflector plate 282 is positioned between the torque plate 280 and the susceptor assembly 130. In some embodiments, heat from the susceptor assembly 130 is progressively reduced with multiple stainless steel plates (reflector plates 282) stacked in parallel. Heat from the heater around the shaft (see FIG. 3) can be reflected back with 17-4 PH steel reflector shields around the drive shaft, keeping the shaft cooler. In some embodiments, the remaining heat conducted through the susceptor is reduced by water cooling the shaft using the water jacket described above with a water rotary union below the shaft. Water, or a coolant, can be passed through gun-drill holes in the thickness of the drive shaft or by bolting a water rotary union below a press-fit aluminum water jacket to the motor shaft.

In some embodiments, angled holes are provided from the inner diameter of the susceptor bottom up to each of the wafer pockets for chucking/dechucking. The angled holes can be connected to the hollow drive shaft with precision machined flat plates without face seals at high temperatures to prevent vacuum leak. The hollow shaft can act like a vacuum plenum, in-case of loss of external vacuum.

In some embodiments, as can be seen in FIGS. 5 and 6, the susceptor assembly 130 comprises a plurality of recesses 133 in a top surface 131 of the susceptor assembly 130. As shown in FIGS. 6-8, a plurality of passages 140 extends from the cavity 212 of the drive shaft 210 to the recesses 133 in the susceptor assembly 130. In some embodiments, as shown in FIG. 9, the passages 140 may comprise a valve in fluid communication with the passage. Multi-zone vacuum chucking enables independent control of each wafer pocket on the carousel, which helps in wafer exchange. Each of the vacuum zones is connected through the rotor shaft that supports the susceptor can be a conduit for various fluids and electrical feeds up to the susceptor, for example, nitrogen gas for purging or wafer de-chucking; multi-zone vacuum can be applied for chucking.

Substrates for use with the embodiments of the disclosure can be any suitable substrate. In detailed embodiments, the substrate is a rigid, discrete, generally planar substrate. As used in this specification and the appended claims, the term "discrete" when referring to a substrate means that the substrate has a fixed dimension. The substrate of specific embodiments is a semiconductor wafer, such as a 200 mm or 300 mm diameter silicon wafer.

As used in this specification and the appended claims, the terms "reactive gas", "reactive precursor", "first precursor", "second precursor" and the like, refer to gases and gaseous species capable of reacting with a substrate surface or a layer on the substrate surface.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, plasmas may not be requisite. Indeed, other embodiments relate to deposition processes under very mild conditions without plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. The details of one such staged-vacuum substrate processing apparatus are disclosed in U.S. Pat. No.

5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and equivalents.

What is claimed is:

1. A motor assembly comprising:
    a motor housing having a top portion and a bottom portion;
    a drive shaft extending a distance from the top portion of the motor housing and having a cavity therein;
    a first motor within the motor housing to rotate the drive shaft within the motor housing about a central axis, the first motor comprising a direct drive motor; and
    a second motor adjacent the bottom portion of the motor housing, the second motor in communication with at least one rail within the motor housing to move the first motor and drive shaft along the central axis.

2. The motor assembly of claim 1, further comprising a seal housing within the motor housing, the seal housing positioned around a portion of the drive shaft.

3. The motor assembly of claim 2, wherein the seal housing is in fluid communication with a vacuum source.

4. The motor assembly of claim 2, wherein the drive shaft comprises at least one channel forming a fluid connection between the cavity of the drive shaft and the seal housing.

5. The motor assembly of claim 4, wherein the at least one channel extends in a direction substantially perpendicular to the central axis.

6. The motor assembly of claim 4, wherein there are four channels.

7. The motor assembly of claim 4, wherein the seal housing comprises an o-ring to form a gas-tight seal between the seal housing and the drive shaft.

8. The motor assembly of claim 1, wherein the second motor is a ball screw motor and there are at least two symmetric rails to move the drive shaft and first motor.

9. The motor assembly of claim 2, further comprising a water jacket in contact with a lower portion of the drive shaft.

10. The motor assembly of claim 9, wherein the seal housing is positioned around a portion of the water jacket.

11. A susceptor assembly, comprising:
    the motor assembly of claim 1; and
    a susceptor in communication with the top portion of the drive shaft.

12. The susceptor assembly of claim 11, further comprising a torque plate forming an interface between the drive shaft and the susceptor.

13. The susceptor assembly of claim 12, further comprising a reflector plate between the torque plate and the susceptor.

14. The susceptor assembly of claim 11, wherein the susceptor comprises a plurality of recesses in a top surface of the susceptor.

15. The susceptor assembly of claim 14, further comprising a plurality of passages extending from the cavity of the drive shaft to the recesses in the susceptor.

16. The susceptor assembly of claim 15, further comprising a valve in fluid communication with the passage.

17. A motor assembly comprising:
    a motor housing having a top portion and a bottom portion;

a drive shaft extending a distance from the top portion of the motor housing and having a cavity therein;

a first motor within the motor housing to rotate the drive shaft within the motor housing about a central axis; and a second motor adjacent the bottom portion of the motor housing, the second motor in communication with at least one rail within the motor housing to move the first motor and drive shaft along the central axis, the second motor comprising a ball screw motor and there are at least two symmetric rails to move the drive shaft and first motor.

* * * * *